US006211018B1

(12) United States Patent
Nam et al.

(10) Patent No.: US 6,211,018 B1
(45) Date of Patent: Apr. 3, 2001

(54) METHOD FOR FABRICATING HIGH DENSITY TRENCH GATE TYPE POWER DEVICE

(75) Inventors: Kee Soo Nam; Sang Gi Kim; Tae Moon Roh; Jin Gun Koo, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/475,281

(22) Filed: Dec. 30, 1999

(30) Foreign Application Priority Data

Aug. 14, 1999 (KR) ................................................. 99-33493
Sep. 18, 1999 (KR) ................................................. 99-40257

(51) Int. Cl.[7] .................................................. H01L 21/336
(52) U.S. Cl. ........................... 438/270; 438/135; 438/268
(58) Field of Search ............................. 438/27, 135, 137, 438/138, 268

(56) References Cited

U.S. PATENT DOCUMENTS

| | | | |
|---|---|---|---|
| 5,595,927 | * | 1/1997 | Chen et al. ............................. 437/52 |
| 5,637,898 | | 6/1997 | Baliga ................................... 257/330 |
| 5,648,283 | * | 7/1997 | Tsang et al. ........................... 437/40 |
| 5,670,392 | * | 9/1997 | Ferla et al. ............................ 437/29 |
| 5,700,727 | * | 12/1997 | Manning ............................... 438/156 |
| 5,891,770 | * | 4/1999 | Lee ....................................... 438/221 |
| 6,001,678 | * | 12/1999 | Takahashi ............................. 438/238 |
| 6,025,233 | * | 2/2000 | Terasawa ............................. 438/270 |

OTHER PUBLICATIONS

Ueda et al., An Ultra–Low On–Resistance Power MOSFET Fabricated by Using a Fully Self–Aligned Process, Apr. 1987, p. 926–930.
Narazaki et al., A Novel 30V P–Channel Trench Gate Power MOSFET With Ultra Law On–State–Resistance at Low–Gate–Voltage, 1997, p. 285–288.

* cited by examiner

*Primary Examiner*—Matthew Smith
*Assistant Examiner*—Renzo N. Rocchegiani
(74) *Attorney, Agent, or Firm*—Jacobson, Price, Holman & Stern, PLLC

(57) ABSTRACT

A semiconductor technique is disclosed. Particularly a low voltage high current power device for use in a lithium ion secondary battery protecting circuit, a DC-DC converter and a motor is disclosed. Further, a method for fabricating a high density trench gate type power device is disclosed. That is, in the present invention, a trench gate mask is used for forming the well and/or source, and for this purpose, a side wall spacer is introduced. In this manner, the well and/or source is defined by using the trench gate mask, and therefore, 1 or 2 masking processes are skipped unlike the conventional process in which the well mask and the source mask are separately used. The decrease in the use of the masking process decreases the mask align errors, and therefore, the realization of a high density is rendered possible. Consequently, the on-resistance which is an important factor for the power device can be lowered.

8 Claims, 13 Drawing Sheets

METHOD FOR FABRICATING HIGH DENSITY TRENCH GATE TYPE POWER DEVICE

BACKGROUND OF THE INVENTION

1. Field of the Invention

The present invention relates to a semiconductor technique, and particularly to a low voltage high current power device for use in a lithium ion secondary battery protecting circuit, a DC-DC converter and a motor. Particularly, the present invention relates to a method for fabricating a high density trench gate type power device.

2. Description of the Prior Art

Generally, the power device based on the MOS (metal oxide semiconductor) technology is classified into: a VDMOS (vertical double-diffused metal oxide semiconductor) in which the source-gate-drain are disposed in the vertical direction; and an LDMOS (lateral double-diffused metal oxide semiconductor) in which the source-gate-drain are disposed in the horizontal direction.

The VDMOS can accommodate a larger electric current than the LDMOS, and therefore, it is used as a large current power device. Further, the VDMOS is classified in accordance with its type into a planar gate type and a trench gate type.

The trench gate type power device has the disadvantage that the fabricating process is complicated, because a trench has to be etched in a silicon substrate, and because a good quality gate oxide layer has to be grown. However, it can build a larger number of devices per unit area compared with the planar gate type power device, and therefore, the on-resistance which is an important factor of a power device can be lowered. Further, it can accommodate a large current with a low driving voltage. Therefore, it is the present trend that the use of the power device is being transferred from the planar gate type power device to the trench gate type power device.

FIG. 1 illustrates the layout of a trench gate type power device. Referring to this drawing, the trench gate type power device 100 is constituted such that a well 104 and a source 106 are defined across a trench gate 102. All the drawings hereinafter will be sectional views taken along a line A-B.

FIGS. 2A to 2C illustrate the fabricating process for the conventional N-channel trench gate type power device. This conventional fabricating process will be described in detail below.

First, as shown in FIG. 2A, an oxide layer 22 is grown upon an $N^-$-epi-layer 21 /$N^+$ silicon substrate 20. Then a P-well mask is used to etch a portion of the oxide layer 22 where a P-well is to be formed. Then a screen oxide layer 23 is grown upon the exposed $N^-$-epi-layer 21 in a thickness of 400 Å. Then an impurity ion implantation is carried out for forming a P-well, and then, a heat treatment is carried out, thereby forming a P-well 24 on the $N^-$-epi-layer 21.

Then as shown in FIG. 2B, a source mask is used to form an $N^+$ source 25, and then, an oxide layer 26 is deposited on the entire structure. Then a trench gate mask is used to etch a portion of the oxide layer 26 where a trench gate is to be formed. Then a hard mask is used on the patterned oxide layer 26 to form a trench which is deeper than the P-well. Then a gate oxide layer 27 is grown along the side wall of the trench, and then, a doped polysilicon film is deposited. Then a gate electrode mask is used on the polysilicon film to carry out an anisotropic etching, thereby forming a trench gate 28.

Under this condition, although there is not illustrated in the drawings, a pad for realizing a gate contact is formed on the edge region.

Then as shown in FIG. 2C, a field oxide layer 29 is deposited on the entire structure, and then, a gate and source electrode contact mask is used to selectively etch the oxide layer 29, thereby forming the gate and source electrode contact holes. Then a metal layer is deposited upon the entire structure, and then, a gate and source electrode mask is used to pattern the gate and source electrodes 30. Then a drain electrode 31 is formed on the rear face of the substrate.

As described above, in the conventional trench gate type power device fabricating process, there are required six masks including the P-well mask, the source mask, the trench gate mask, the gate electrode mask, the gate and source electrode contact mask, and the gate and source electrode mask. Further, in the case where $P^+$ ions are implanted into the source region, another sheet of mask is additionally required.

Thus a large number of masks is required in the conventional fabricating process, and therefore, the fabricating process becomes complicated, while the fabricating cost is increased. Further, due to the increase in the number of the masking processes, align errors are induced, with the result that the realization of a high density is hindered, and that the yield is lowered. Due to this difficulty of realizing the high density, the on-resistance which is an important factor of the power device is degraded.

SUMMARY OF THE INVENTION

The present invention is intended to overcome the above described disadvantages of the conventional technique.

Therefore it is an object of the present invention to provide a method for fabricating a trench gate type power device, in which the on-resistance is improved.

In achieving the above object, the method for fabricating a trench gate type power device according to the present invention includes the steps of: a) forming an insulating layer upon a semiconductor substrate; b) using a trench gate mask to pattern the insulating layer; c) carrying out an ion implantation by using the insulating layer (thus patterned) as an ion implantation mask, for forming a well; d) further using the insulating layer as an ion implantation mask to carry out an ion implantation for forming a source; e) forming a spacer insulating layer on side walls of the insulating layer; f) using the insulating layer and the spacer insulating layer as etch masks to form a trench on the semiconductor substrate and to define a source region; g) forming a gate insulating layer on inside walls of the trench; h) filling a gate electrode material into the trench, with the gate insulating layer having been formed thereon; and i) forming a source electrode electrically contacted to the source region, and forming a drain electrode electrically contacted to a rear face of the semiconductor substrate.

In another aspect of the present invention, the method for fabricating a trench gate type power device according to the present invention includes the steps of: a) forming a first insulating layer upon a semiconductor substrate; b) using a well mask to pattern the first insulating layer; c) carrying out an ion implantation by using the first insulating layer (thus patterned) as an ion implantation mask, for forming a well; e) forming a second insulating layer upon an entire structure after completing step c); f) using a trench gate mask to pattern the second insulating layer; g) using the patterned first and second insulating layers as ion implantation masks to carry out an ion implantation for forming a source; h)

forming a spacer insulating layer on side walls of the first and second insulating layers; i) using the first and second insulating layers and the spacer insulating layer as etch masks to form a trench on the semiconductor substrate and to define a source region; j) forming a gate insulating layer on side walls of the trench; k) filling a gate electrode material into the trench, with the gate insulating layer having been formed thereon; l) selectively removing the second insulating layer; m) etching an exposed portion of the semiconductor substrate after the step l), to form a source contact region; and n) forming a source electrode electrically contacted to the source region, and forming a drain electrode electrically contacted to a rear face of the semiconductor substrate.

In still another aspect of the present invention, the method for fabricating a trench gate type power device according to the present invention includes the steps of: a) forming an insulating layer upon a semiconductor substrate; b) using a trench gate mask to pattern the insulating layer; c) carrying out an ion implantation by using the insulating layer (thus patterned) as an ion implantation mask, for forming a well; d) forming a spacer insulating layer on side walls of the insulating layer; e) using the insulating layer and the spacer insulating layer as etch masks to form a trench on the semiconductor substrate; f) forming a gate insulating layer on inside walls of the trench; g) filling a gate electrode material into the trench, with the gate insulating layer having been formed thereon; h) removing the spacer insulating layer; i) using the insulating layer as an ion implantation mask to carry out an ion implantation for forming a source region; and j) forming a source electrode electrically contacted to the source region, and k) forming a drain electrode electrically contacted to a rear face of the semiconductor substrate.

That is, in the present invention, a trench gate mask is used for forming the well and/or source, and for this purpose, the side wall spacer is introduced. In this manner, the well and/or source is defined by using the trench gate mask, and therefore, 1 or 2 masking processes are skipped unlike the conventional process in which the well mask and the source mask are separately used. The decrease in the use of the masking process decreases the mask align errors, and therefore, the realization of a high density is rendered possible. Consequently, the on-resistance which is an important factor for the power device can be lowered.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

The preferred embodiments of the present invention will be described in such a manner that those ordinarily skilled in the art can easily carry out the present invention.

FIGS. 3A to 3G illustrate a first embodiment of the N-channel trench gate type power device according to the present invention. The first embodiment will be described referring to these drawings.

Figure 1:
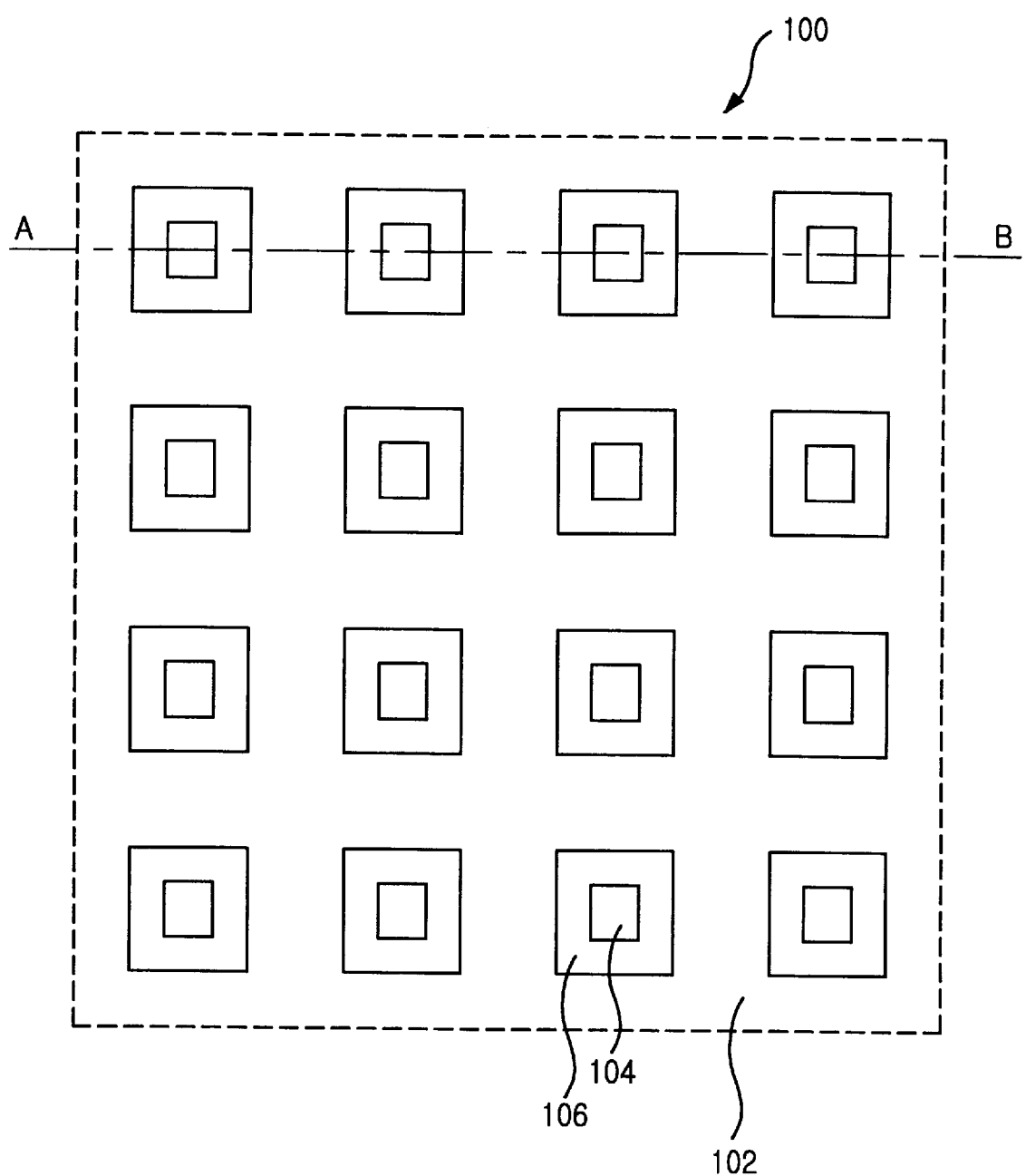
FIG. 1 illustrates the layout of a high density trench gate type power device.
Figure 2A:
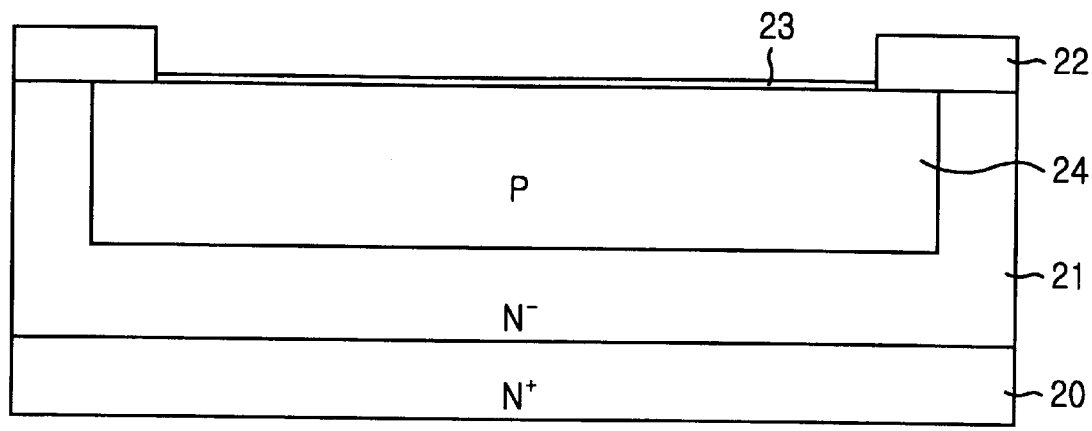
FIGS. 2A to 2C illustrate the fabricating process for the conventional trench gate type power device.
Figure 2B:
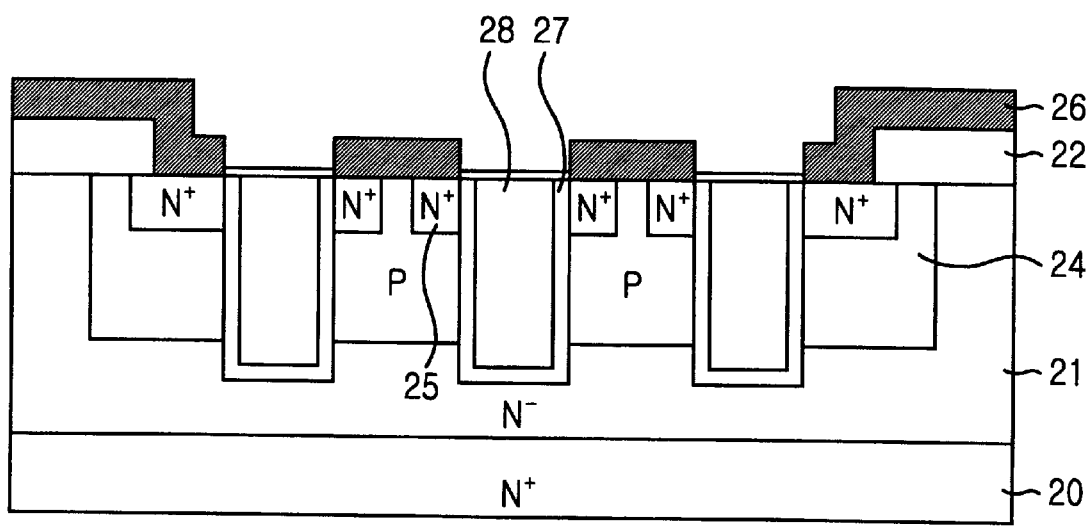
Figure 2C:
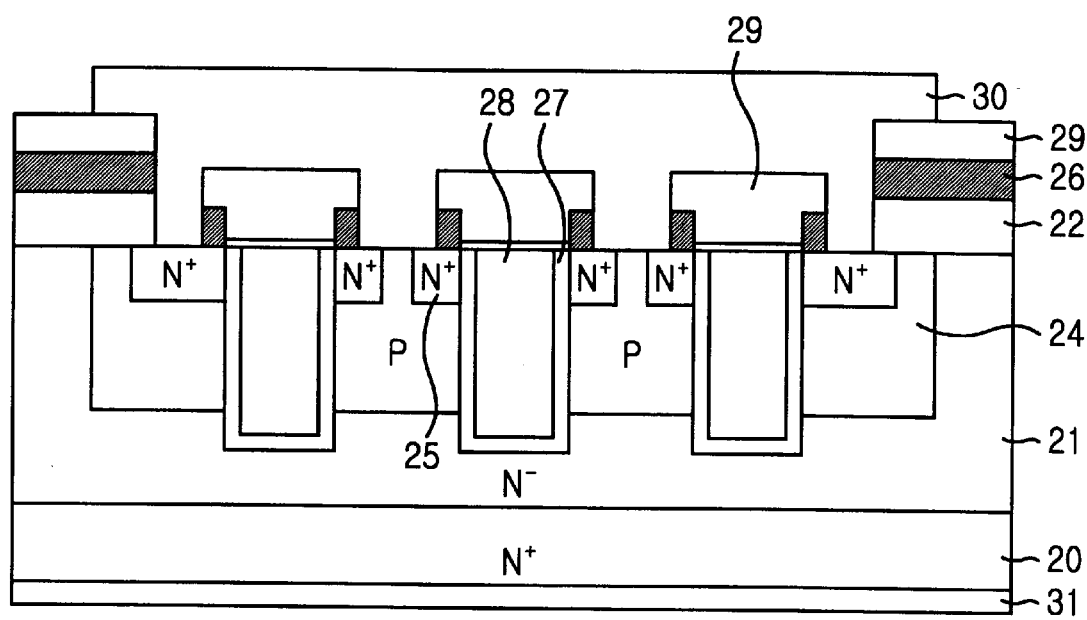
Figure 3A:
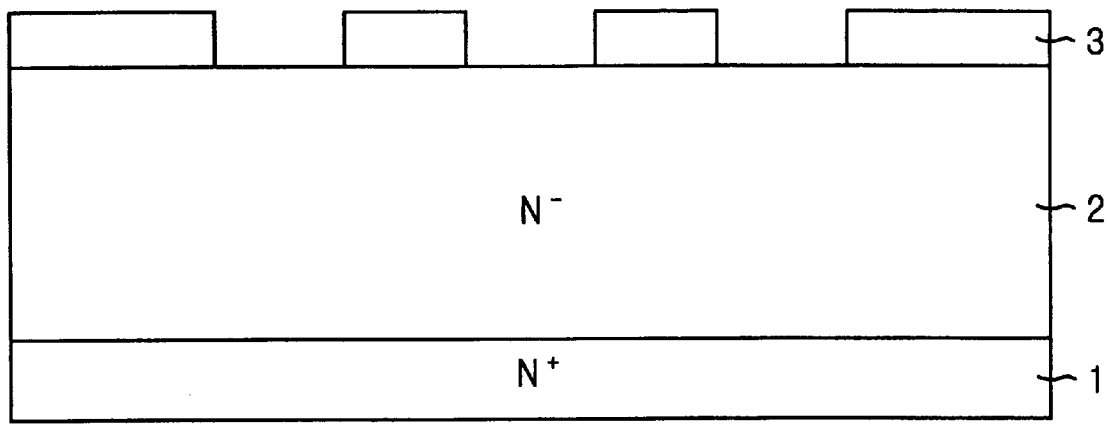
FIGS. 3A to 3G illustrate a first embodiment of the fabricating method for the trench gate type power device according to the present invention.

First as shown in FIG. 3A, an $N^-$-epi-layer 2 with a resistivity of 0.3–1 $\Omega$-cm and with a thickness of 3–8 $\mu$m is grown on an $N^+$ silicon substrate 1 which has a resistivity of 0.004 $\Omega$-cm or less. Then an oxide layer 3 is grown in a thickness of 4000–5000 $\mu$m at a temperature of 900–1100° C. by using an electric furnace, and thereupon, a photoresist is spread. Then a portion where a trench gate is to be formed is defined by using a trench gate mask. Then a plasma ion etching process is applied to anisotropically etch the oxide layer so as to remove the photoresist.

Figure 3B:
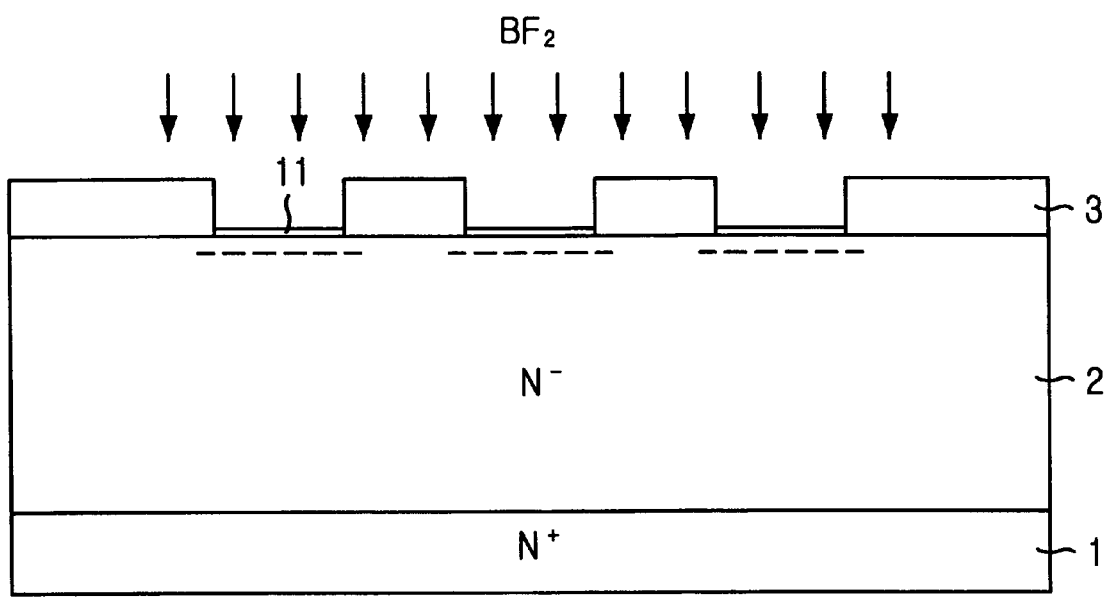

Then as shown in FIG. 3B, a screen oxide layer 11 is grown in a thickness of 400 Å on the exposed $N^-$-epi-layer 2, and then, $BF_2$ is ion-implanted with an energy of 60–80 KeV and at a dose of 1–3E13/cm$^2$.

Figure 3C:
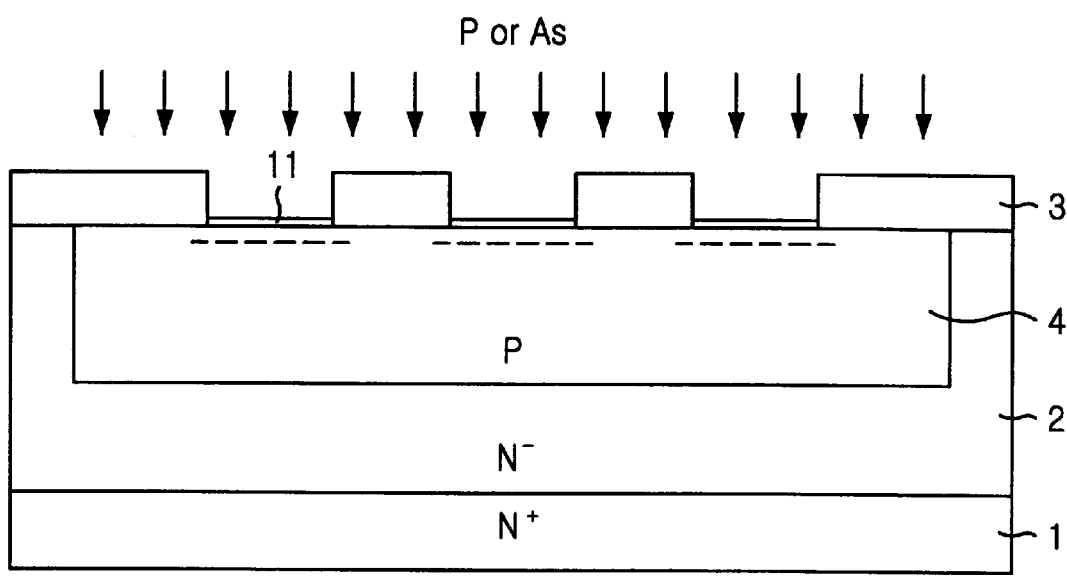

Then as shown in FIG. 3C, a heat treatment is carried out at a temperature of 1000–1150° C., thereby forming a P-well 4 with a depth of 1.2–2 $\mu$m. Then in order to form a source region 6, P or As is ion-implanted vertically or inclinedly with an energy of 60–80 KeV and at a dose of 3–5E15/cm$^2$, and then, a heat treatment is carried out.

Figure 3D:
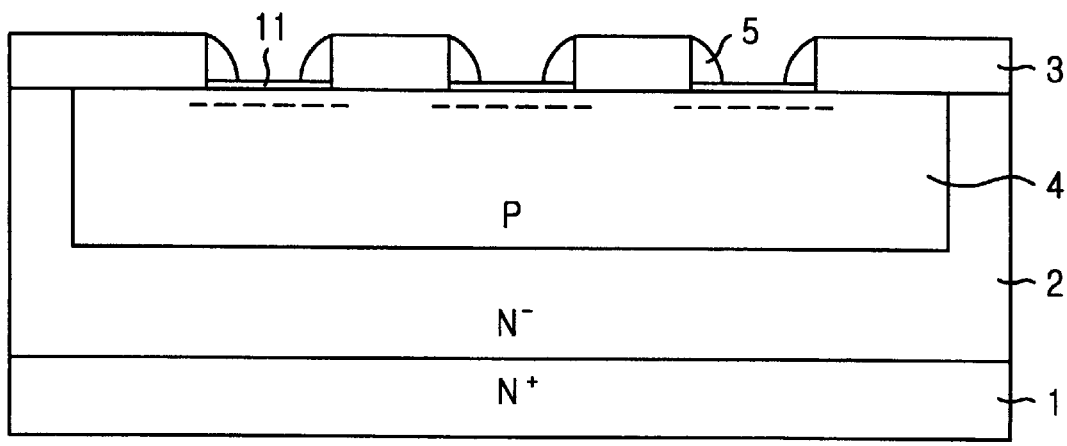

Then as shown in FIG. 3D, a TEOS (tetraethylotho silicate) oxide layer or LTO (low temperature oxide) layer is deposited in a thickness of 2000–5000 Å. Then the entire surface of the oxide layer is etched by applying a plasma ion etch process, thereby forming a spacer oxide layer 5.

Figure 3E:
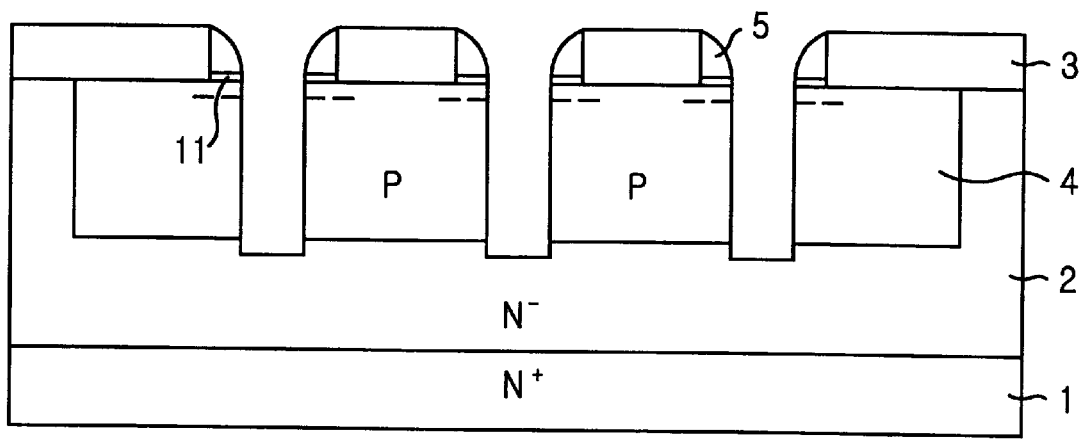

Then as shown in FIG. 3E, the oxide layer 3 and the spacer oxide layer 5 are used as etch masks to etch the exposed screen oxide layer 11 and the P-well 4 by applying a plasma ion etching process so as to form a trench structure. Under this condition, the P-well is etched at least as deep as the P-well. Then in order to remove the defects on the side walls of the trench, a sacrificial layer (not illustrated) is grown in a thickness of 500–1000 Å at a temperature of 850–1100° C., and is removed.

Figure 3F:
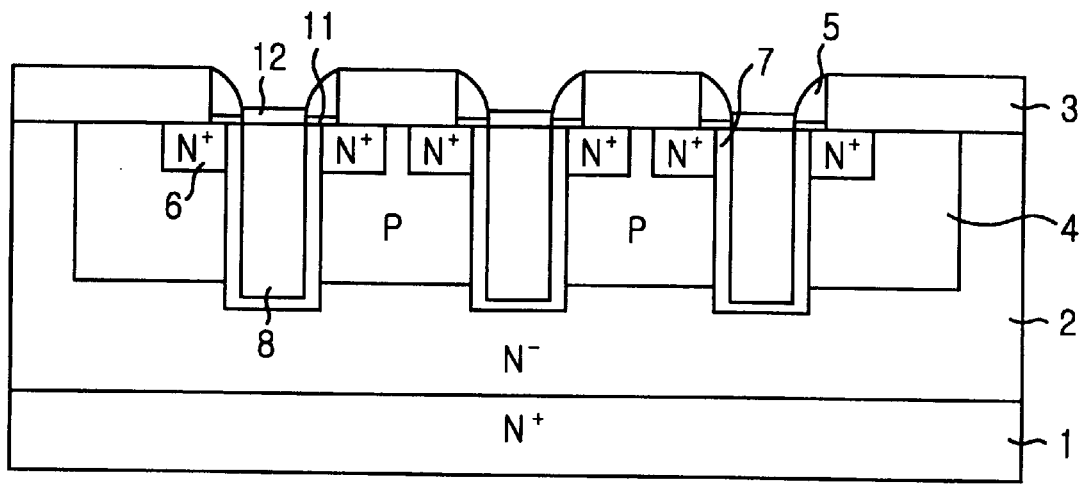

Then as shown in FIG. 3F, a gate oxide layer 7 is grown in a thickness of 300–500 Å on the inside wall of the trench, and then, a P (phosphorus)-doped polysilicon film is deposited. Then a gate electrode mask is used to anisotropically etch the polysilicon film, thereby forming a trench gate 8. Then a gate protecting oxide layer 12 is grown in a thickness of 300–1000 Å on the surface of the exposed trench gate 8.

Figure 3G:
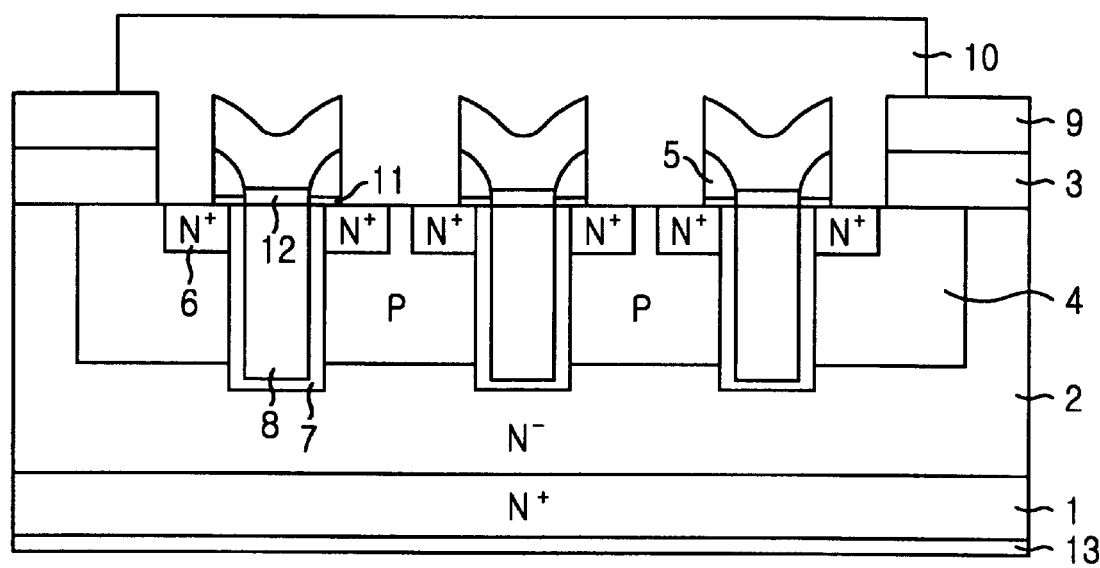

Then as shown in FIG. 3G, a field oxide layer 9 is deposited in a thickness of 7000–8000 Å on the entire structure. Then a photo etch process is applied to form contact holes for the source electrode and the gate electrode. Then a metal layer is deposited on the entire structure, and then, a photo etching process is applied to form a source electrode 10, and to form a drain electrode 13 on the rear face of the substrate.

In the case where the trench gate type power device is fabricated by the above described process, a well mask and a source mask are omitted, and therefore, the number of the masks can be reduced to four (including the trench gate mask, the gate electrode mask, the gate and source electrode contact mask, and the gate and source electrode mask). The decrease in the use of the masking process decreases the mask align errors, and therefore, the process margin can be increased. Thus if the area per unit device is decreased, the on-resistance is naturally lowered.

FIGS. 4A to 4D illustrate a second embodiment of the trench gate type power device according to the present invention.

Figure 4A:
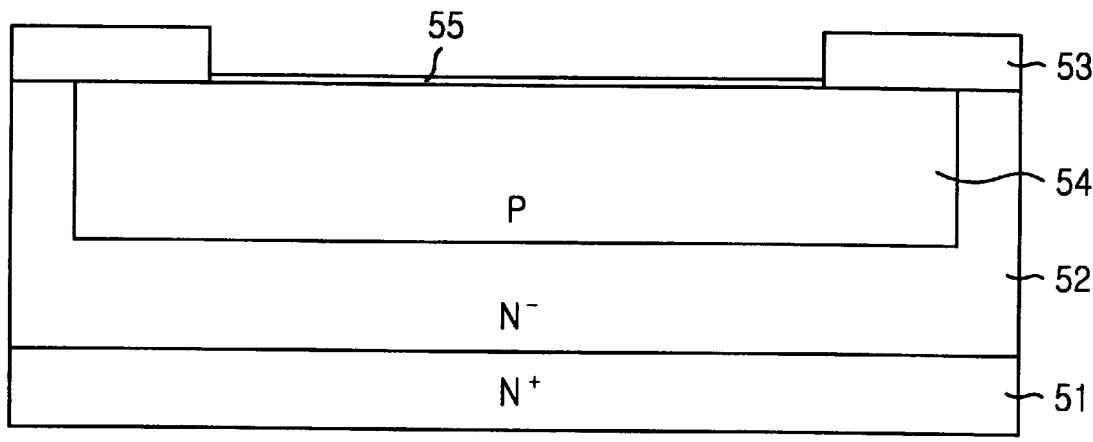
FIGS. 4A to 4D illustrate a second embodiment of the fabricating method for the trench gate type power device according to the present invention.

This second embodiment will be described. First as shown in FIG. 4A, an N$^-$- epi-layer 52 with a resistivity of 0.3–1 Ω-cm and with a thickness of 3–8 μm is grown on an N$^+$ silicon substrate 51 which has a resistivity of 0.004 Ω-cm or less. Then an oxide layer 53 is grown in a thickness of 4000–5000 Å at a temperature of 900–1100° C. by using an electric furnace, and thereupon, a photoresist is spread. Then a portion where a trench gate is to be formed is defined by using a trench gate mask. Then a plasma ion etching process is applied to anisotropically etch the oxide layer so as to remove the photoresist. Then a screen oxide layer 55 is formed in a thickness of 400 Å on the exposed N$^-$-epi-layer 52. Then BF$_2$ is ion-implanted with an energy of 60–80 KeV and at a dose of 1–3E13/cm$^2$. Then a heat treatment is carried out at a temperature of 1000–1150° C., thereby forming a P-well 54 with a depth of 1.2–2 μm.

Figure 4B:
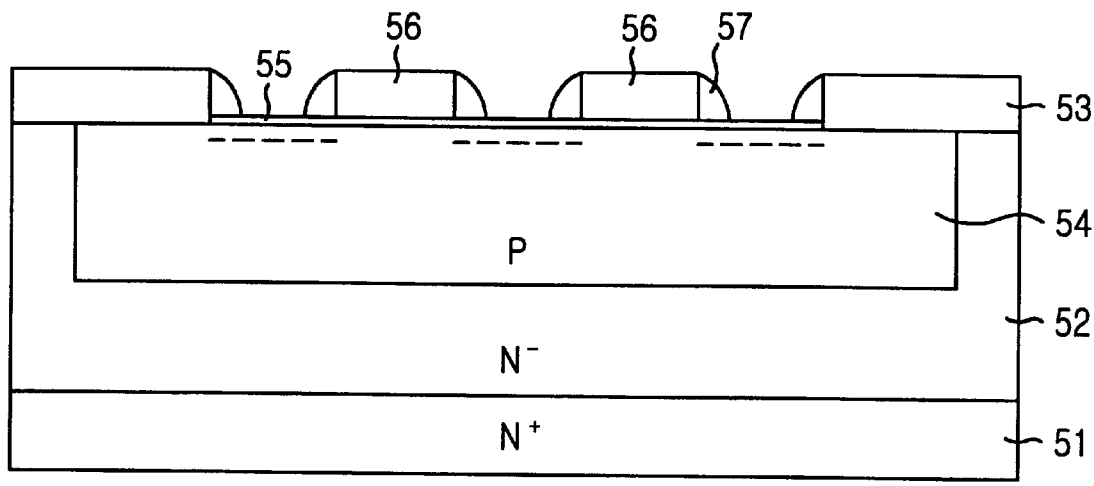

Then as shown in FIG. 4B, a silicon nitride layer 56 with a thickness of 3000–5000 Å is deposited on the entire structure. Then a trench gate mask is used to define a portion where the trench gate is to be formed. Then the silicon nitride layer 56 is selectively etched, and then, in order to form a source region, P or As is ion-implanted vertically or inclinedly with an energy of 60–80 KeV and at a dose of 3–5E15/cm$^2$. Then a TEOS oxide layer or an LTO layer is deposited in a thickness of 2000–5000 Å, and then, a plasma etching process is carried out to etch the entire surface, thereby forming a spacer oxide layer 57.

Figure 4C:
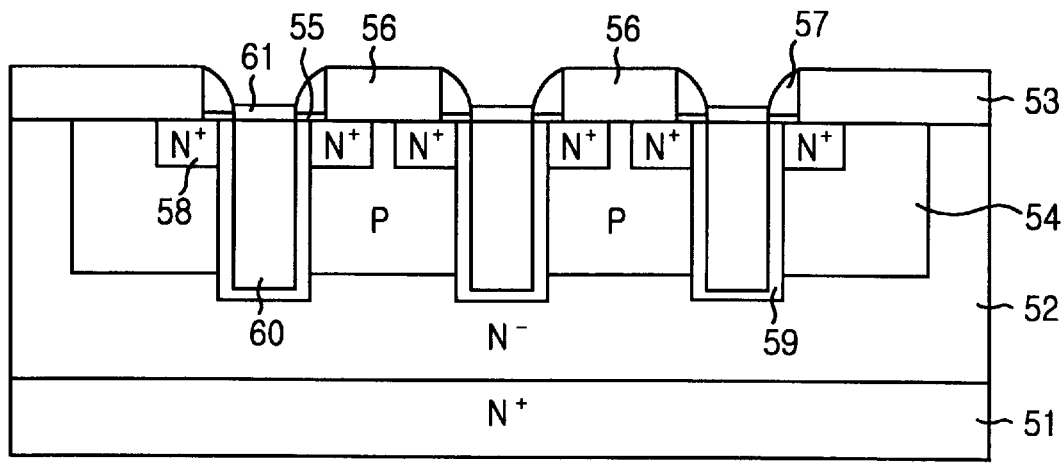

Then as shown in FIG. 4C, by using the silicon nitride layer 56 and the spacer oxide layer 57 as the etch masks, a plasma ion etching process is carried out to etch the exposed screen oxide layer 55 and the P-well 54, so as to form a trench structure. Under this condition, the trench is etched as deep as the P-well 54. In order to remove the defects on the inside wall of the trench, a sacrificial layer (not illustrated) is grown in a thickness of 500–1000 Å at a temperature of 850–1100 Å and is removed. Then a gate oxide layer 59 is grown in a thickness of 300–500 Å on the inside wall of the trench. Then a phosphorus-doped polysilicon film is deposited, and then, a gate electrode mask is used to anisotropically etch the polysilicon film so as to form a trench gate 60. Then a gate protecting layer 61 is grown in a thickness of 3000–5000 □ on the surface of the exposed trench gate 60. Reference code 58 indicates an N$^+$ source.

Figure 4D:
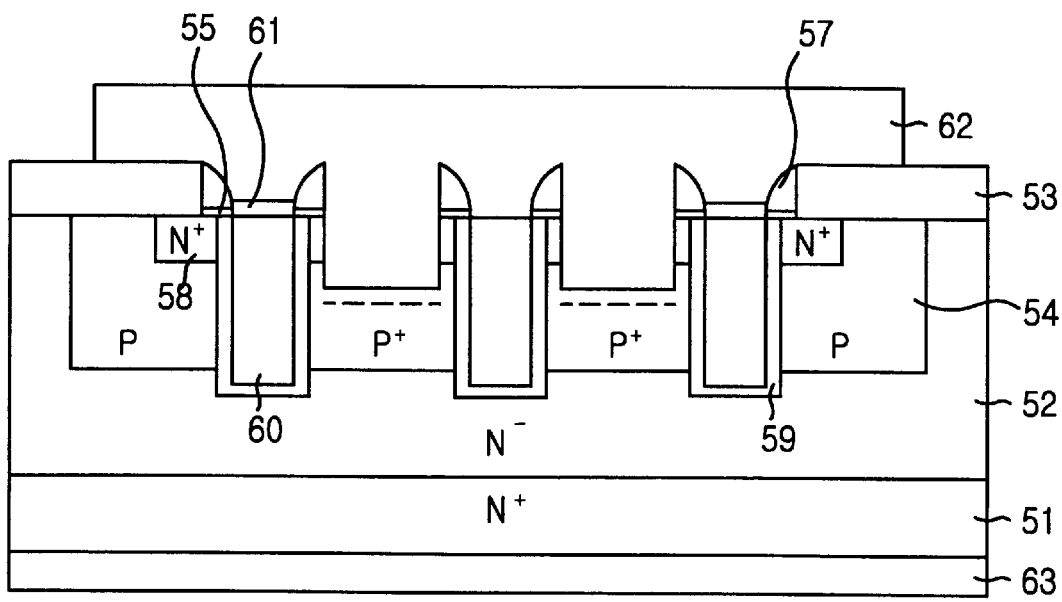

Then as shown in FIG. 4D, the silicon nitride layer 54 is removed, and by using the spacer oxide layer 57 and the protecting oxide layer 61 as masks, a plasma etching is carried out on the N$^+$ source 58 and the P-well 54, thereby forming a source contact region. Then a P$^+$ impurity is ion-implanted into the source contact region, and then, a heat treatment is carried out. Then a metal layer is deposited upon the entire structure, and the metal layer is patterned so as to form the gate and source electrode 62, while a drain electrode 63 is formed on the rear face of the substrate.

If the above fabricating process is carried out, there are required only 5 masks (the well mask, the trench gate mask, the gate electrode mask, the gate and source contact mask, and the gate and source electrode mask) in total. Therefore, like in the first embodiment, the fabricating process can be simplified, and the on-resistance can be improved.

FIGS. 5A to 5F illustrate a third embodiment of fabricating method for the trench gate type power device according to the present invention.

Figure 5A:
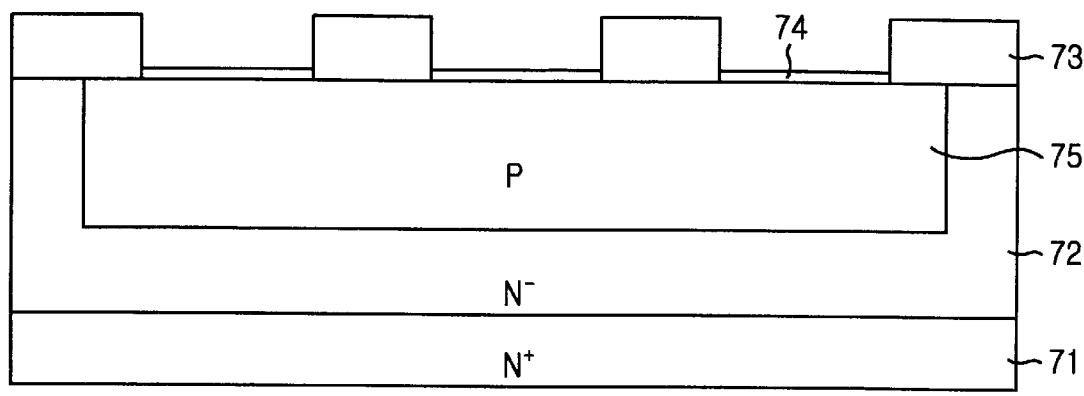
FIGS. 5A to 5F illustrate a third embodiment of the fabricating method for the trench gate type power device according to the present invention.

This third embodiment will be described. First as shown in FIG. 5a, an N$^-$-epi-layer 72 with a resistivity of 0.3–1 Ω-cm and with a thickness of 3–8 μm is grown on an N$^+$ silicon substrate 71 which has a resistivity of 0.004 Ω-cm or less. Then an oxide layer 73 is grown in a thickness of 4000–5000 Å at a temperature of 900–1100 Å by using an electric furnace, and thereupon, a photoresist is spread. Then a portion where a trench gate is to be formed is defined by using a trench gate mask. Then a plasma ion etching process is applied to anisotropically etch the oxide layer so as to remove the photoresist. Then a screen oxide layer 74 is formed in a thickness of 400 Å on the exposed N$^-$-epi-layer 72. Then BF$_2$ is ion-implanted with an energy of 60–80 KeV and at a dose of 1–3E13/cm$^2$. Then a heat treatment is carried out at a temperature of 1000–1150 Å, thereby forming a P-well 75 with a depth of 1.2–2 μm.

Figure 5B:
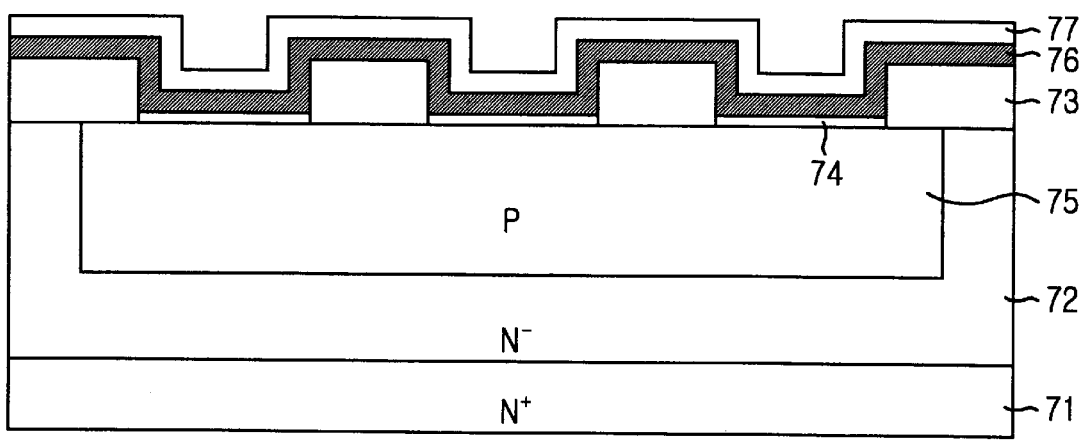

Then as shown in FIG. 5B, a silicon nitride layer 76 in a thickness of 1000–4000 Å and a silicon oxide layer 77 in a thickness of 1000–4000 Å are sequentially deposited on the entire surface of the structure. Under this condition, the silicon oxide layer 77 may be TEOS or LTO.

Figure 5C:
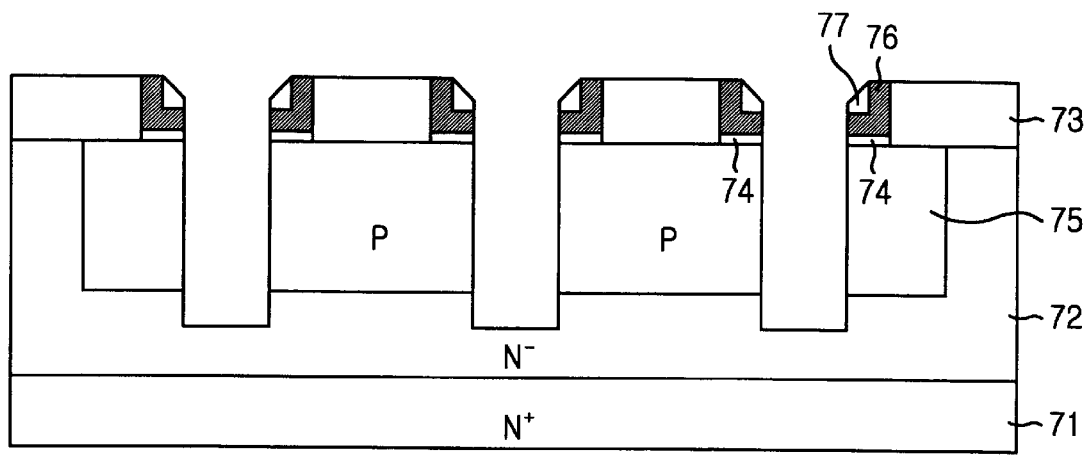

Then as shown in FIG. 5C, the entire areas of the silicon oxide layer 77 and the silicon nitride layer 76 are etched to form side wall spacers 76 and 77 on the oxide layer 73. Then by using the oxide layer 73 and the side wall spacers 76 and 77 as etch masks, a plasma ion etching is carried out on the exposed oxide layer 74 and the P-well 75 so as to form a trench with depth at least same as that of the P-well 75. Then in order to remove the defects of the inside walls of the trench, a sacrificial layer (not illustrated) is grown in a thickness of 500–1000 Å at a temperature of 850–1100° C., and is removed.

Figure 5D:
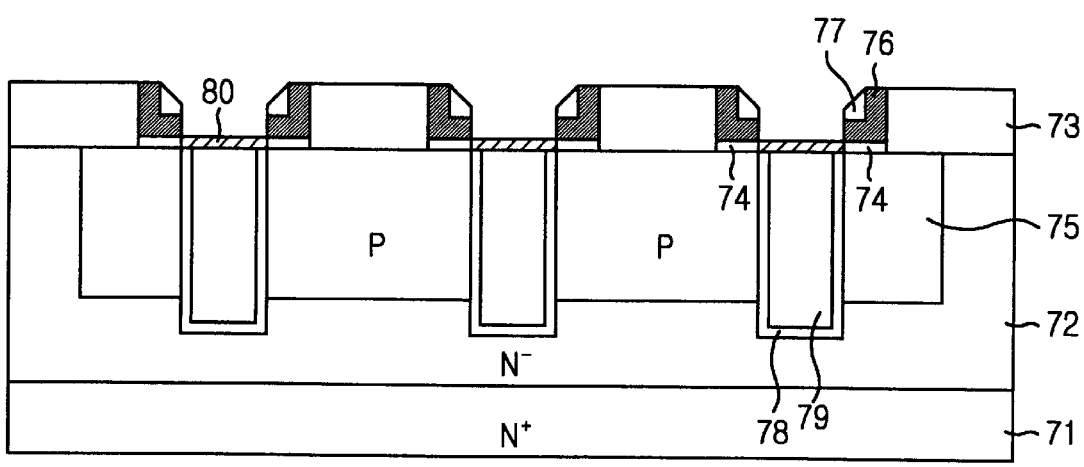

Then as shown in FIG. 5D, a gate oxide layer 78 is grown in a thickness of 300–500 Å on the inside walls of the trench. Then a phosphorus-doped polysilicon film is deposited, and then, a gate electrode mask is used to anisotropically etch the polysilicon film to form a trench gate 79. Then a gate protecting layer 80 is grown in a thickness of 1000–4000 Å on the surface of the exposed trench gate 79.

Figure 5E:
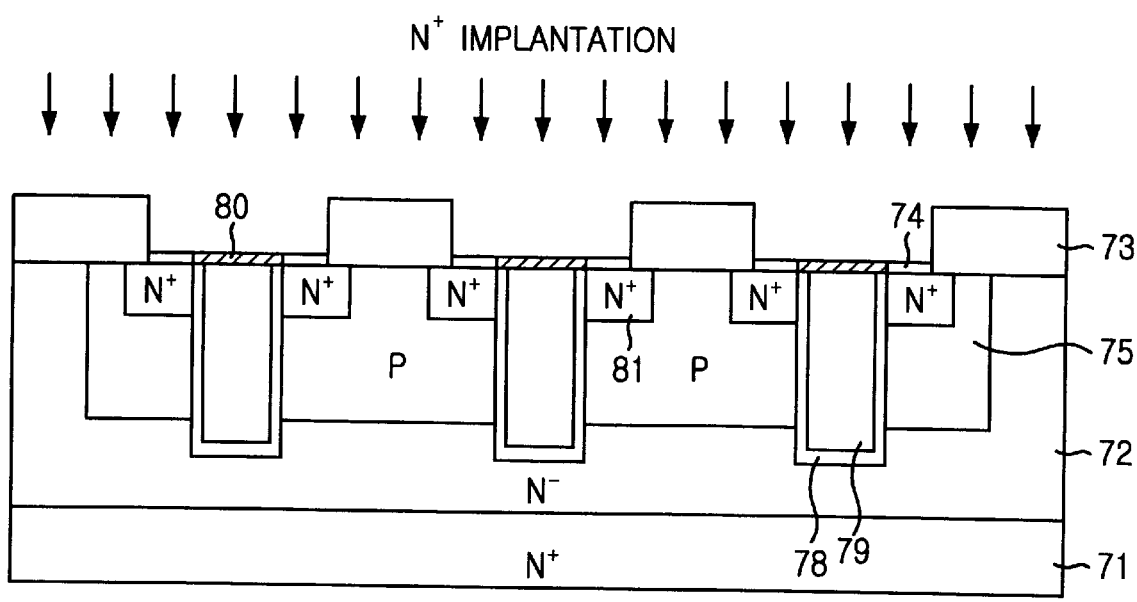

Then as shown in FIG. 5E, the side wall spacers 76 and 77 are removed. Then P or As is ion-implanted with an energy of 60–80 KeV and at a dose of 3–5E15/cm$^2$, and then, a heat treatment is carried out, thereby forming a source 81.

Figure 5F:
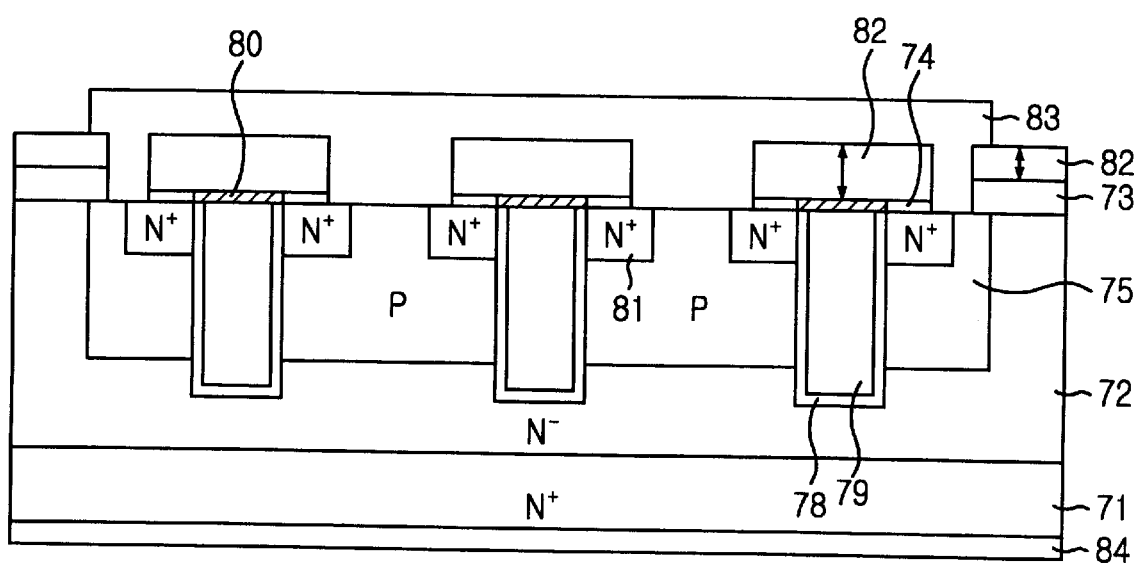

Then as shown in FIG. 5F, an oxide layer 82 for serving as a field oxide layer is deposited upon the entire structure in a thickness of 7000–8000 Å. Then a photo etching process is carried out to form contact holes for the source and the gate. Then a metal layer is deposited, and a photo etching process is carried out to form the gate and the source electrode 83, and to form a drain electrode 84 on the rear face of the substrate.

In the case where the trench gate type power device is fabricated by the above described process, the number of the masks can be reduced to four (including the trench gate mask, the gate electrode mask, the gate and source electrode contact mask, and the gate and source electrode mask).

Figure 6:
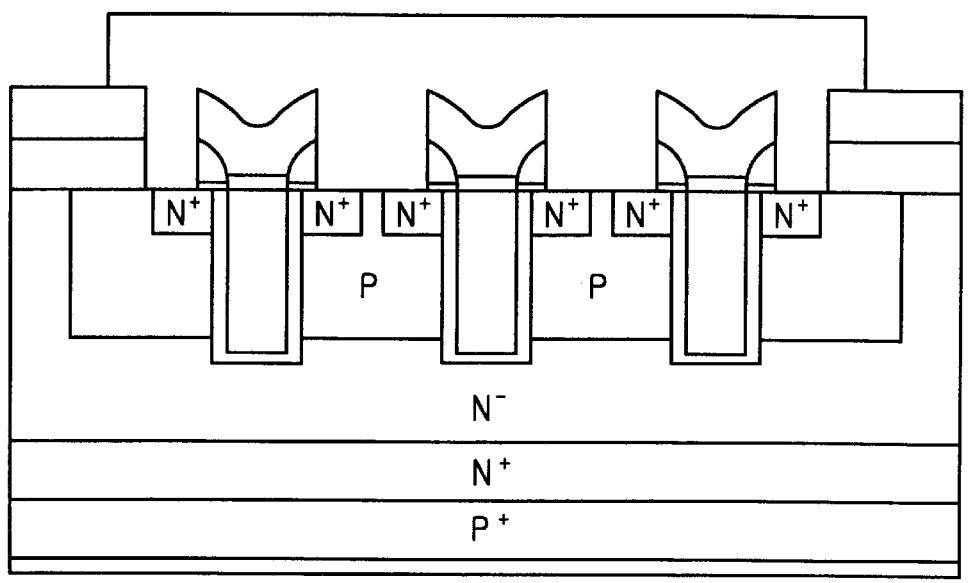
FIG. 6 is a sectional view showing an IGBT (insulated gate bipolar transistor) type power device as a fourth embodiment of the present invention.

Meanwhile, FIG. 6 illustrates an IGBT (insulated gate bipolar transistor) manufactured in a 4th embodiment of the present invention. In the first and third embodiments, the N$^-$-epi-/N$^+$ substrate was used, but in this 4th embodiment, an N⁻-epi/N⁺-epi/P⁺ substrate structure is used. Except this fact, the fabricating process is same as those of the first and third embodiments.

Figure 7:
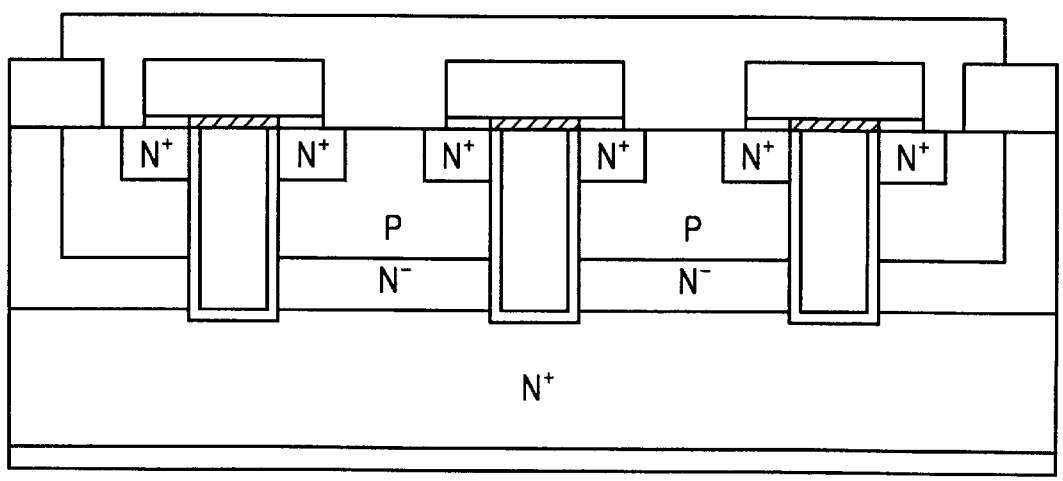
FIG. 7 is a sectional view showing a trench gate type power device as a fifth embodiment of the present invention.

FIG. 7 is a sectional view showing a trench gate type power device as a fifth embodiment of the present invention. The fabricating process for this device is same as that of the first and third embodiments of the present invention, except that a thin N⁻-epi-layer of 2–3 μm is used. The difference lies in the fact that when forming the trench structure, an etching is carried out deeper than the N⁻-epi-layer, down to the N⁺ substrate. If such a thin N⁻-epi-layer is used, although the breakdown voltage is lowered, the resistance of the drift region can be reduced, and therefore, the on-resistance which is an important factor for the power device can be lowered, this being an advantage.

In the above-described first to fifth embodiments, the material of the side wall spacer can be substituted. Further, when the oxide layer patterning is carried out (e.g., the oxide layer 73 of the third embodiment), if the side wall is made inclined, then a gradient of the impurity profile can be formed during the ion implantation, and therefore, the electrical characteristics of the power device can be improved.

According to the present invention as described above, the number of the masking processes is decreased, and therefore, it will be advantageous for achieving a high density, while the on-resistance which is an important factor of the power device can be lowered. Further, owing to the decrease of the number of the masking processes, the cost for the masks can be curtailed.

In the above, the present invention was described based on the specific embodiments and the drawings, but it should be apparent to those ordinarily skilled in the art that various changes and modifications can be added without departing from the spirit and scope of the present invention which will be limited only by the appended claims.

What is claimed is:

1. A method for fabricating a trench gate type power device, comprising the steps of:
   a) forming an insulating layer upon a semiconductor substrate;
   b) using a trench gate mask to pattern said insulating layer;
   c) carrying out an ion implantation by using said insulating layer (thus patterned) as an ion implantation mask, for forming a well;
   d) using said insulating layer as an ion implantation mask to carry out an ion implantation for forming a source;
   e) forming a spacer insulating layer on side walls of said insulating layer;
   f) using said insulating layer and said spacer insulating layer as etch masks to form a trench on said semiconductor substrate and to define a source region;
   g) forming a gate insulating layer on inside walls of said trench;
   h) filling a gate electrode material into said trench, with said gate insulating layer having been formed thereon; and
   i) forming a source electrode electrically contacted to said source region, and forming a drain electrode electrically contacted to a rear face of said semiconductor substrate.

2. The method as claimed in claim 1, wherein said spacer insulating layer has a thickness of 2000–5000 Å.

3. A method for fabricating a trench gate type power device, comprising the steps of:
   a) forming a first insulating layer upon a semiconductor substrate;
   b) using a well mask to pattern said first insulating layer, thereby obtaining a patterned first insulating layer;
   c) implanting ions into the semiconductor substrate by using the patterned first insulating layer as an ion implantation mask;
   d) forming a second insulating layer on top of the patterned first insulating layer and a portion of the semiconductor substrate which is not covered by the patterned first insulating layer;
   e) using a trench gate mask to pattern said second insulating layer;
   f) using said patterned first and second insulating layers as ion implantation masks to carry out an ion implantation for forming a source;
   g) forming a spacer insulating layer on side walls of said first and second insulating layers;
   h) using said first and second insulating layers and said spacer insulating layer as etch masks to form a trench on said semiconductor substrate and to define a source region;
   i) forming a gate insulating layer on side walls of said trench;
   j) filling a gate electrode material into said trench, with said gate insulating layer having been formed thereon;
   k) selectively removing said second insulating layer;
   l) etching an exposed portion of said semiconductor substrate after the step k), to form a source contact region; and
   m) forming a source electrode electrically contacted to said source region, and forming a drain electrode electrically contacted to a rear face of said semiconductor substrate.

4. The method as claimed in claim 3, wherein said first insulating layer and said spacer insulating layer are silicon oxide layers, and said second insulating layer is a silicon nitride layer with a thickness of 3000–5000 Å.

5. The method as claimed in claim 3, wherein said spacer insulating layer has a thickness of 2000–5000 Å.

6. A method for fabricating a trench gate type power device, comprising the steps of:
   a) forming an insulating layer upon a semiconductor substrate;
   b) using a trench gate mask to pattern said insulating layer;
   c) carrying out an ion implantation by using said insulating layer (thus patterned) as an ion implantation mask, for forming a well;
   d) forming a spacer insulating layer on side walls of said insulating layer;
   e) using said insulating layer and said spacer insulating layer as etch masks to form a trench on said semiconductor substrate;
   f) forming a gate insulating layer on inside walls of said trench;
   g) filling a gate electrode material into said trench, with said gate insulating layer having been formed thereon;
   h) removing said spacer insulating layer;
   i) using said insulating layer as an ion implantation mask to carry out an ion implantation for forming a source region; and
   j) forming a source electrode electrically contacted to said source region, and forming a drain electrode electrically contacted to a rear face of said semiconductor substrate.

7. The method as claimed in claim 6, wherein said spacer insulating layers include the silicon oxide layer having a thickness of 1000–4000 Å and a silicon nitride layer having a thickness of 1000–4000 Å, respectively.

8. The method as claimed in claim 6, wherein at the second step, said insulating layer is patterned so as to make its side walls inclined.

* * * * *